(12) United States Patent
Hwang et al.

(10) Patent No.: US 11,877,445 B2
(45) Date of Patent: Jan. 16, 2024

(54) INTEGRATED ASSEMBLIES AND SEMICONDUCTOR MEMORY DEVICES

(71) Applicant: Micron Technology, Inc., Boise, ID (US)

(72) Inventors: Sangmin Hwang, Boise, ID (US); Kyuseok Lee, Boise, ID (US); Christopher G. Wieduwilt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 438 days.

(21) Appl. No.: 17/150,020

(22) Filed: Jan. 15, 2021

(65) Prior Publication Data

US 2022/0231029 A1 Jul. 21, 2022

(51) Int. Cl.
| | | |
|---|---|---|
| *H10N 70/20* | (2023.01) | |
| *H10B 12/00* | (2023.01) | |
| *H01L 27/092* | (2006.01) | |
| *H01L 29/78* | (2006.01) | |
| *G11C 11/4091* | (2006.01) | |
| *G11C 11/408* | (2006.01) | |
| *G11C 5/06* | (2006.01) | |

(52) U.S. Cl.
CPC ............ *H10B 12/50* (2023.02); *G11C 5/063* (2013.01); *G11C 11/4085* (2013.01); *G11C 11/4091* (2013.01); *H01L 27/0924* (2013.01); *H01L 29/785* (2013.01); *H10B 12/36* (2023.02)

(58) Field of Classification Search
None
See application file for complete search history.

(56) References Cited

U.S. PATENT DOCUMENTS

| | | |
|---|---|---|
| 9,543,298 B1 | 1/2017 | Zang et al. |
| 9,865,704 B2 | 1/2018 | Xie et al. |
| 10,256,155 B1 | 4/2019 | Lin et al. |
| 10,297,290 B1 | 5/2019 | Beigel et al. |
| 10,586,795 B1 | 3/2020 | Sills et al. |
| 10,811,405 B2 | 10/2020 | Yoshida et al. |
| 11,239,242 B2 | 2/2022 | Yang et al. |

(Continued)

OTHER PUBLICATIONS

Yang et al., U.S. Appl. No. 17/197,253, titled "Integrated Assemblies and Semiconductor Memory Devices", filed Mar. 10, 2021, 59 pages.

*Primary Examiner* — Joseph C. Nicely
*Assistant Examiner* — Lamont B Koo
(74) *Attorney, Agent, or Firm* — Wells St. John P.S.

(57) ABSTRACT

Some embodiments include an integrated assembly having a CMOS region. Fins extend across the CMOS region and are on a first pitch. A circuit arrangement is associated with the CMOS region and includes segments of one or more of the fins. The circuit arrangement has a first dimension along a first direction. A second region is proximate the CMOS region. Conductive structures are associated with the second region. The conductive structures extend along a second direction different than the first direction. Some of the conductive structures are electrically coupled with the circuit arrangement. The conductive structures are on a second pitch different from the first pitch. A second dimension is a distance across said some of the conductive structures along the first direction, and the second dimension is substantially the same as the first dimension.

33 Claims, 8 Drawing Sheets

(56) References Cited

U.S. PATENT DOCUMENTS

| | | |
|---|---|---|
| 2016/0329276 A1 | 11/2016 | Lin et al. |
| 2017/0053917 A1 | 2/2017 | Azmat et al. |
| 2017/0141211 A1 | 5/2017 | Xie et al. |
| 2017/0236869 A1* | 8/2017 | Tran ................. H10B 63/30 257/4 |
| 2018/0012891 A1 | 1/2018 | Yabuuchi et al. |
| 2018/0174650 A1* | 6/2018 | Chung |
| 2019/0074040 A1* | 3/2019 | Mentovich .......... G11C 11/4097 |
| 2020/0035272 A1 | 1/2020 | Nakaoka |
| 2020/0286895 A1 | 9/2020 | Tang et al. |
| 2020/0286906 A1 | 9/2020 | Karda et al. |
| 2020/0365589 A1 | 11/2020 | Liaw |
| 2022/0320281 A1 | 10/2022 | Lan et al. |

* cited by examiner

INTEGRATED ASSEMBLIES AND SEMICONDUCTOR MEMORY DEVICES

TECHNICAL FIELD

Integrated assemblies. Integrated memory. Multi-deck assemblies. FinFET, CMOS, FinFET integration, CMOS integration, etc.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or nonvolatile. Nonvolatile memory cells can store data for extended periods of time including when the computer is turned off. Volatile memory dissipates and therefore is rapidly refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

Some memory cells may include a transistor in combination with a capacitor (or other suitable charge-storage device). The transistor is utilized to selectively access the capacitor, and may be referred to as an access device. The capacitor may electrostatically store energy as an electric field within capacitor dielectric between two capacitor plates. The electrical state of the capacitor may be utilized to represent a memory state.

The wordlines may be coupled with wordline-driver-circuitry, and the digit lines may be coupled with sense-amplifier-circuitry. The wordline-driver-circuitry and sense-amplifier-circuitry may be within a CMOS region of an integrated assembly.

Memory is one example of integrated circuitry, and many other types of integrated circuitry are known (e.g., sensor circuitry, logic circuitry, etc.). Such other types of integrated circuitry may be utilized in combination with integrated memory in some applications.

A continuing goal of integrated assembly fabrication is to increase the level of integration, or, in other words, to pack ever-more memory into ever-decreasing space. It is desired to develop new architectures for integrated assemblies, and it is desired for such new architectures to be suitable for highly-integrated applications.

DETAILED DESCRIPTION OF THE ILLUSTRATED EMBODIMENTS

Some embodiments include architectures (integrated assemblies) having CMOS regions with fins (i.e., FinFET arrangements), and having conductive lines (e.g., wordlines, digit lines, etc.) arranged on a suitable pitch to achieve desired alignment of the conductive lines with circuit arrangements (e.g., WORDLINE DRIVERS, SENSE AMPLIFIERS, etc.) associated with the CMOS regions. Example embodiments are described with reference to FIGS. 1-6.

Figure 1:
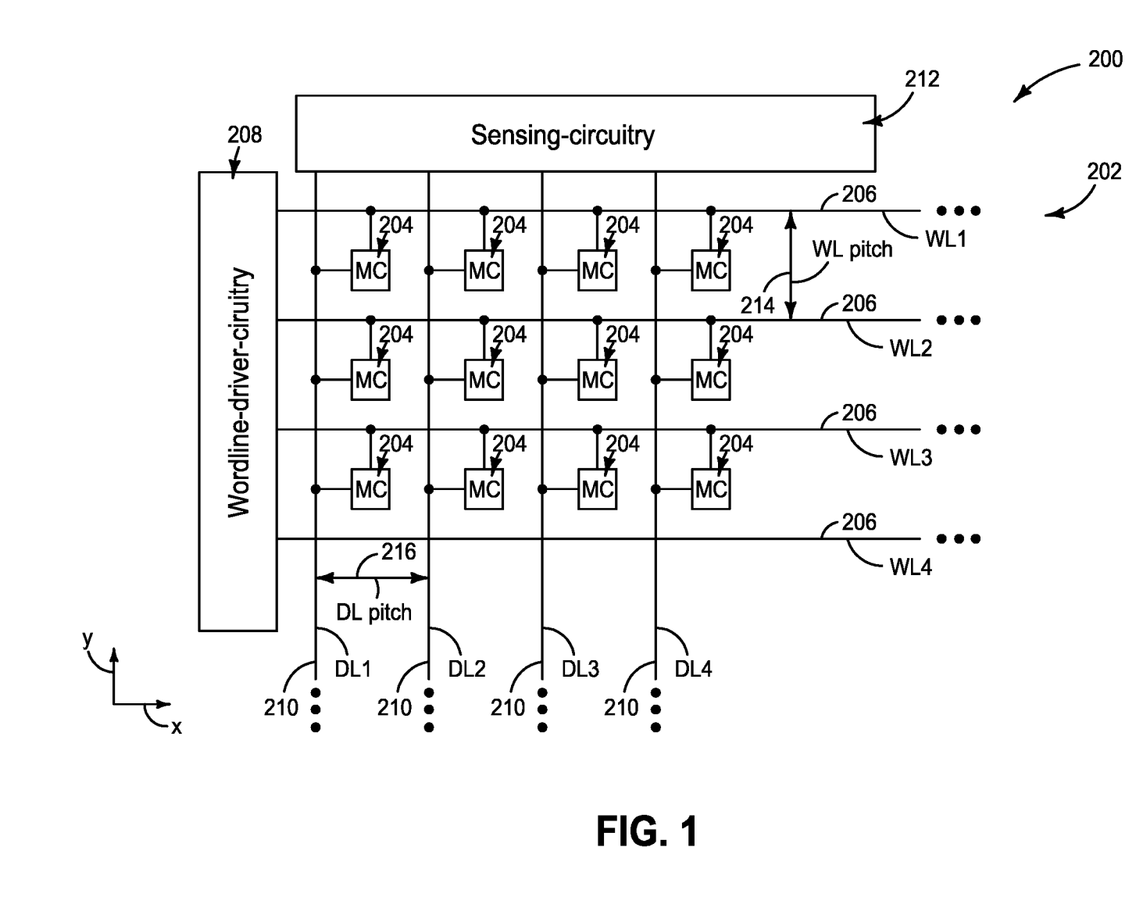
FIG. 1 is a schematic diagram of an example region of an example integrated memory array.

Referring to FIG. 1, an integrated assembly 200 is shown to comprise memory cells (MC) 204 arranged within a memory array 202. The memory cells may be any suitable memory cells either now known or yet to be developed. In some embodiments, the memory cells may be configured for utilization in dynamic random-access memory (DRAM). In such embodiments, the memory cells may each comprise an access device (e.g., a transistor) in combination with a storage-element (e.g., a capacitor).

Wordlines (access lines) 206 extend along a first direction (an illustrated x-axis direction), and cross the memory array 202. The illustrated wordlines are labeled as WL1-WL4. The wordlines are coupled with wordline-driver-circuitry 208 (e.g., WORDLINE DRIVERS).

Digit lines (bitlines, sense lines) 210 extend along a second direction (an illustrated y-axis direction), and cross the memory array 202. The illustrated digit lines are labeled as DL1-DL4. The digit lines are coupled with sensing-circuitry (e.g., SENSE AMPLIFIERS) 212.

The term "sense/access line" may be utilized to generically refer to wordlines and digit lines.

Each of the memory cells 204 may be considered to be uniquely addressed by one of the wordlines 206 in combination with one of the digit lines 210.

In the shown embodiment, the second direction (y-axis direction) is orthogonal to the first direction (x-axis direction). Generally, the digit lines 210 extend orthogonally, or at least substantially orthogonally, relative to the wordlines 206; with the term "substantially orthogonal" meaning orthogonal to within reasonable tolerances of fabrication and measurement.

In some embodiments, the wordlines 206 may be considered to be a first set of conductive lines, and the digit lines 210 may be considered to be a second set of conductive lines. The first and second sets of conductive lines cross one another, and in the illustrated embodiment are shown to be orthogonal to one another (or at least substantially orthogonal to one another).

The wordlines 206 are shown to be spaced from one another by a wordline pitch 214 (WL pitch), and the digit lines 210 are shown to be spaced from another by a digit line pitch 216 (DL pitch). The wordline pitch may be the same as the digit line pitch (or at least substantially the same as the digit line pitch), or may be different than the digit line pitch. It is noted that the pitch is not simply the space between features, but instead refers to a measurement on which a pattern repeats. Thus, the pitch includes, for example, a feature width and a width of a space between neighboring features (or, sometimes, half of the width of the space and half of the width of the features). In the case of wordlines and digit lines (with "WL/DL" being generic to wordlines and digit lines) the pitch may include the width of a WL/DL together with the width of a space between neighboring WLs/DLs.

In practice, a semiconductor assembly may comprise one or more regions containing CMOS circuitry, and the driver circuitry 208 and sensing circuitry 212 may be associated with the CMOS circuitry. The memory array may be formed within another region of the semiconductor assembly, and the wordlines 206 and digit lines 210 may extend across the array and be coupled with the circuitry (e.g., the driver circuitry 208 and sensing circuitry 212) associated with the CMOS circuitry.

It may be challenging to align the wordlines 206 and the digit lines 210 with the CMOS circuitry, and embodiments described below may be utilized to address such challenges. The wordlines and digit lines are examples of conductive structures which may be aligned with regions containing CMOS circuitry (i.e., circuitry associated with CMOS regions). Although, the embodiments described herein are primarily described relative to the alignment of wordlines and digit lines with circuitry associated with CMOS regions, persons of ordinary skill will understand that the embodiments may be utilized for aligning other conductive structures besides wordlines and digit lines with circuitry associated with CMOS regions.

Figure 2:
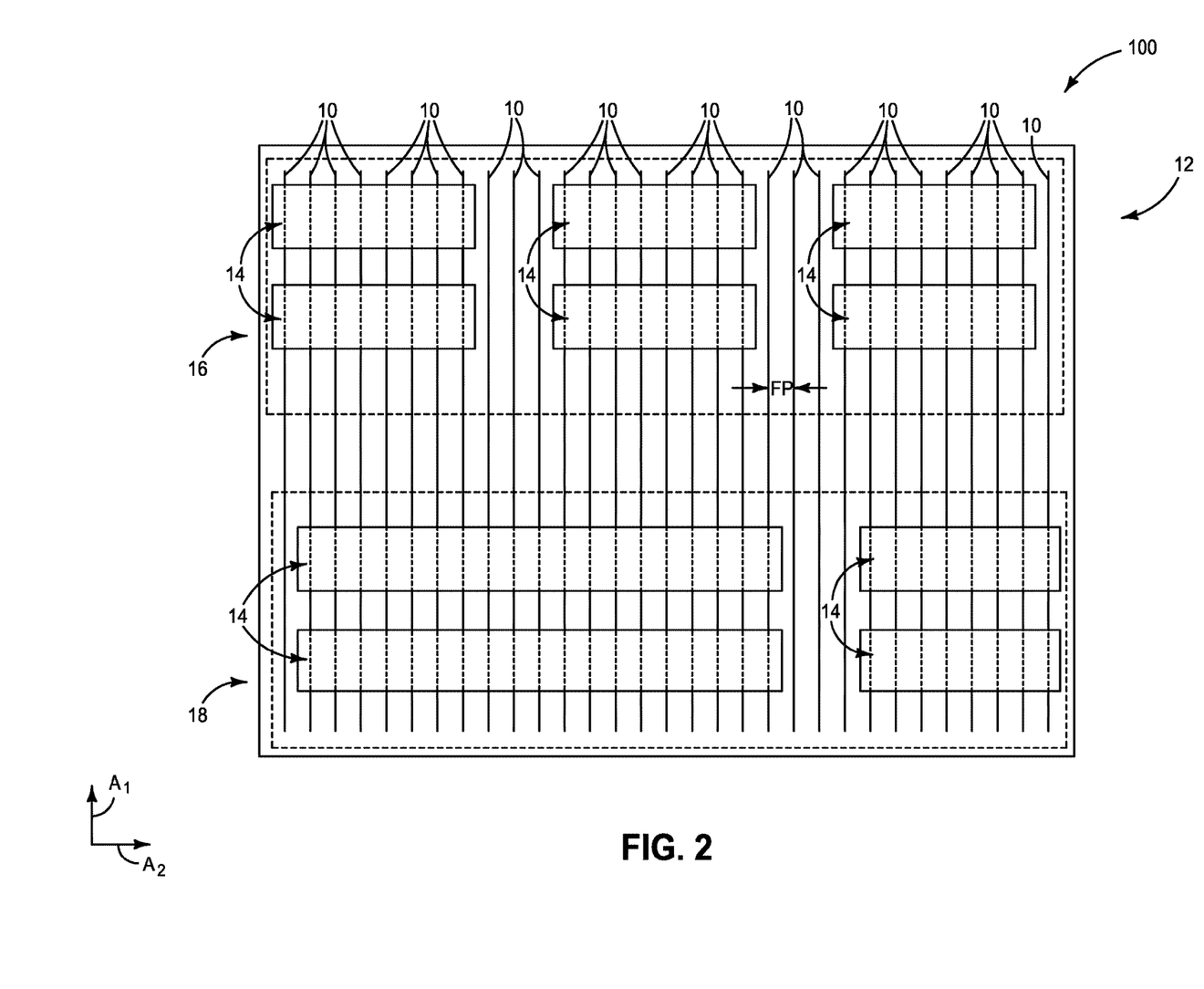
FIG. 2 is a diagrammatic top-down view of an example region of an example CMOS-containing semiconductor base.

Referring to FIG. 2, a portion of a CMOS region 100 is illustrated. The CMOS region may be formed in a semiconductor base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

Fins 10 extend across the CMOS region 100. The fins may be raised regions of the substrate 12. The fins may extend across the entirety of the CMOS region 100, and are incorporated into FinFETs (fin field-effect transistors). The fins 10 are on a fin pitch (FP), with such fin pitch being established by a fabrication process utilized to form the fins.

Gating structures 14 extend across the fins 10. The gating structures may comprise any suitable material(s), and in some embodiments may comprise silicon (e.g., polycrystalline silicon, amorphous silicon, mixtures of polycrystalline silicon and amorphous silicon, etc.), metal, metal-containing material (e.g., metal nitride, metal silicide, etc.), etc.

Regions of the fins 10 under the gating structures 14 are shown in dashed-line (phantom) view to indicate that they would be hidden by the gating structures in the top-down view of FIG. 2.

The fins 10 are shown to extend along a first direction (a direction of an illustrated $A_1$ axis), and the gating structures 14 are shown extend along a second direction (a direction of an illustrated $A_2$ axis); with the second direction being orthogonal to (or at least substantially orthogonal to) the first direction. One of the illustrated $A_1$ and $A_2$ axes may correspond to the x-axis of FIG. 1, and the other may correspond to the y-axis of FIG. 1.

The gating structures 14 and fins 10 are incorporated into circuit arrangements (e.g., WORDLINE DRIVERS, SENSE AMPLIFIERS, etc.). A pair of example circuit arrangements are diagrammatically illustrated in FIG. 2 as arrangements 16 and 18. Dashed-line boxes are utilized to diagrammatically illustrate approximate boundaries of the circuit arrangements 16 and 18. In practice, one of the circuit arrangements 16 and 18 may correspond to WORDLINE DRIVER circuitry and the other may correspond to SENSE AMPLIFIER circuitry. The circuit arrangements 16 and 18 are shown proximate to one another in FIG. 2 to simplify the drawing. In practice, the circuit arrangements 16 and 18 may be physically far apart from one another. For example, the regions 16 and 18 may be along different orthogonal edges of a memory array relative to one another in conventional (planar) memory configurations (e.g., DRAM configurations), may be under different edges of a memory array in CMOS-under-memory-array configurations, etc.

Each of the circuit arrangements 16 and 18 may be coupled with multiple conductive lines from the memory array 202 of FIG. 1. For instance, multiple wordlines may extend to WORDLINE DRIVER circuitry, and multiple digit lines may extend to SENSE AMPLIFIER circuitry. It is desired to align the circuit arrangements 16 and 18 with the conductive lines coupled therewith (e.g., to align the SENSE AMPLIFIER circuitry with the digit line 210 coupled therewith, to align the WORDLINE DRIVER circuitry with the wordlines 206 coupled therewith, etc.).

The fins 10 of the CMOS region 100 may be parallel to one set of the sense/access lines 206 and 210 of the array 202 of FIG. 1, and may be orthogonal to the other set of the sense/access lines. Specifically, if the $A_1$ axis of FIG. 2 corresponds to the y-axis of FIG. 1, then the fins 10 are parallel to (or at least substantially parallel to) the digit lines 210, and are orthogonal to (or at least substantially orthogonal to) the wordlines 206. Alternatively, if the $A_1$ axis of FIG. 2 corresponds to the x-axis of FIG. 1, then the fins 10 are parallel to (or at least substantially parallel to) the wordlines 206, and are orthogonal to (or at least substantially orthogonal to) the digit lines 210. This creates two different sets of problems for aligning the sense/access lines 206 and 210 of FIG. 1 with the circuit arrangements 16 and 18 of FIG. 2. Specifically, one set of problems is associated with the alignment of conductive lines with circuit arrangements having fins 10 parallel to (or at least substantially parallel to) the conductive lines, and another set of problems is associated with the alignment of conductive lines with circuit arrangements having fins 10 perpendicular to (or at least substantially perpendicular to) the conductive lines. Both sets of problems are addressed in the discussion that follows.

Figure 3A:
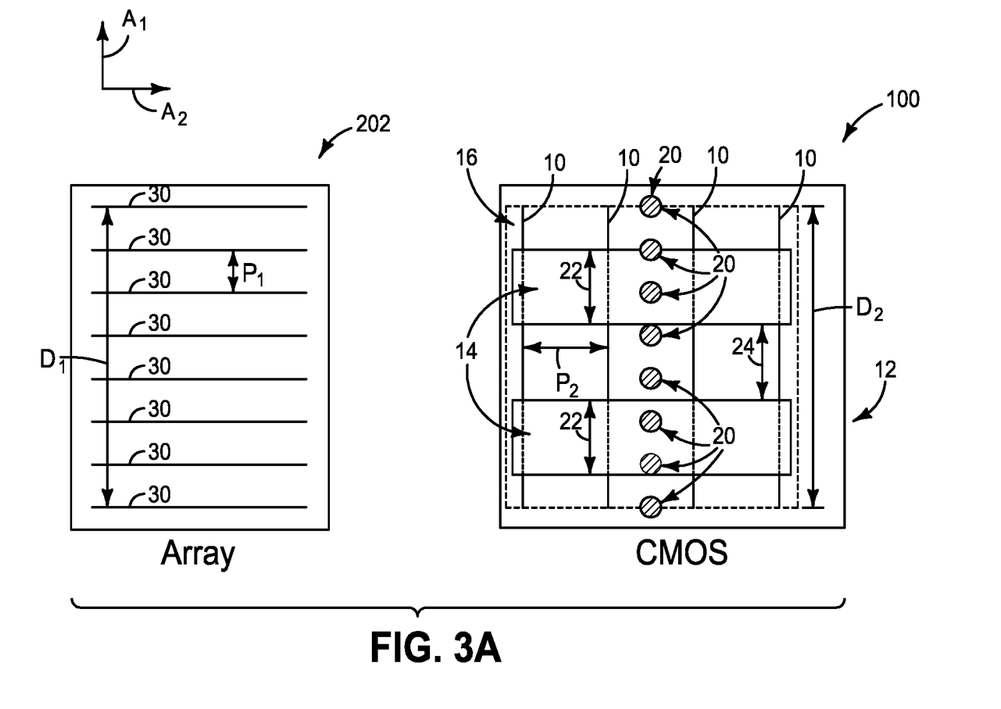
FIGS. 3A and 3B are diagrammatic top-down views of an example region of an example CMOS-containing semiconductor base and an example region of an integrated memory array proximate the base.

Referring to FIG. 3A, a portion of the array region 202 is shown proximate a portion of the CMOS region 100. The array region 202 may be considered generally as a second region which is provided proximate to a first region corresponding to the CMOS region 100.

The illustrated portion of the array region 202 comprises a set of conductive lines 30 arranged on a pitch $P_1$. The lines 30 may be, for example, either the wordlines 206 or the digit lines 210 of FIG. 1, and in some embodiments may be referred to as sense/access lines to indicate that they may be wordlines or digit lines.

The array region 202 is offset from the illustrated portion of the CMOS region 100. Although the array region 202 is shown to be laterally offset from the illustrated portion of the CMOS region, it is to be understood that the array region may be in any suitable location relative to the illustrated portion of the CMOS region; and may, for example, be vertically offset from the illustrated portion of the CMOS region either alternatively to, or in addition to, being laterally offset from the illustrated portion of the CMOS region (i.e., may be over the CMOS region in CMOS-under-array configurations).

The CMOS region 100 has the fins 10 arranged on a pitch $P_2$. In some embodiments, one of the pitches $P_1$ and $P_2$ may be referred to as a first pitch and the other may be referred to as a second pitch. The first pitch is different from the second pitch. In the illustrated embodiment, the pitch $P_2$ is larger than the pitch $P_1$ (i.e., the sense/access lines 30 of the array 202 are formed on a tighter pitch than the fins 10 of the CMOS region 100).

The CMOS region 100 is shown to comprise the circuit arrangement 16, with such circuit arrangement comprising segments of four of the fins 10, and comprising two of the gating regions 14 extending across the fins. The circuit arrangement 16 may be, for example, SENSE AMPLIFIER circuitry in some embodiments, WORDLINE DRIVER circuitry in some embodiments, etc. Although the circuit arrangement is shown comprising segments of four fins, in other embodiments the circuit arrangement may comprise more than four fins or fewer than four fins. The SENSE AMPLIFIER circuitry may include one or more SENSE AMPLIFIERS, and similarly the WORDLINE DRIVER circuitry may include one or more WORDLINE DRIVERS.

The illustrated gating regions 14 both extend across all four of the fins 10 of the circuit arrangement 16. In other embodiments, one of the gating regions may extend across fewer fins than the other of the gating regions. The circuit arrangement may comprise any suitable number of the gating regions, and may comprise a different number of the gating regions than the illustrated two gating regions.

Figure 3B:
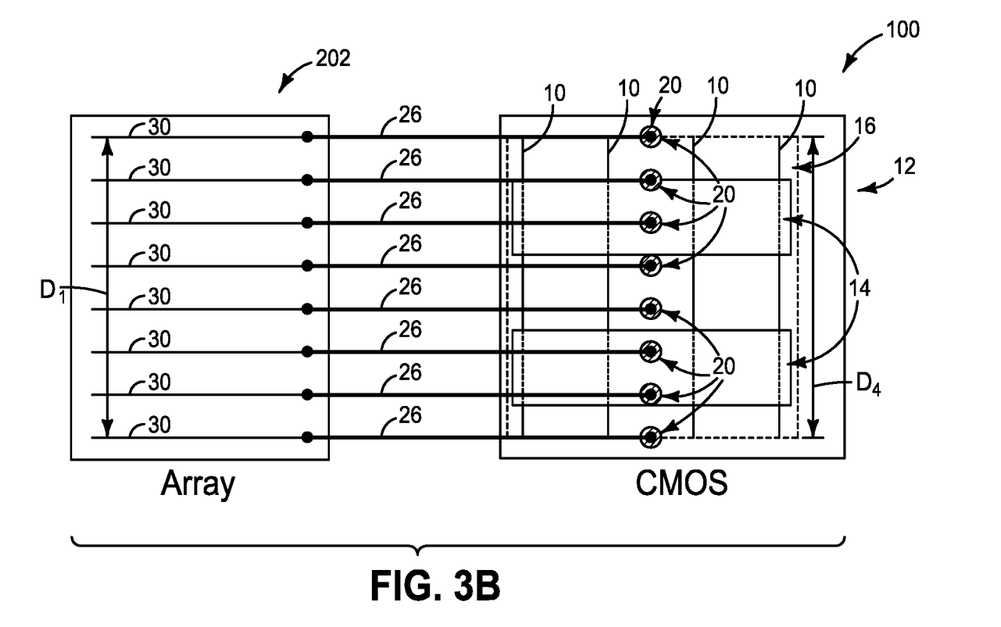

In the illustrated application, eight of the lines 30 are to be coupled with the circuit arrangement 16. Such eight of the lines 30 may be a subset of the total number of digit lines or wordlines of the array 202, and accordingly may represent some of the digit lines 210 or some of the wordlines 206 of the array. For instance, in some embodiments the array may comprise hundreds, thousands, hundreds of thousands, millions, etc., of the conductive lines 30 corresponding to the digit lines 210 or wordlines 206, and the circuit arrangement 16 may be one of many circuit arrangements coupled with such conductive lines so that only a small fraction of the conductive lines may extend to the particular circuit arrangement 16 of FIG. 3A. Although FIGS. 3A and 3B show all of the lines 30 being coupled with the circuit arrangement 16 of the CMOS region 100, it is to be understood that in other embodiments only some of the lines 30 may be coupled with such circuit arrangement. For instance, the lines may be part of an open architecture of DRAM, with an example open architecture being discussed in more detail below with reference to FIG. 4C.

The circuit arrangement 16 has conductive pads 20 configured for coupling with the sense/access lines 30. The conductive pads 20 are shown to be arranged along a column for purposes of illustration, but may be in any suitable locations within the circuit arrangement 16.

The circuit arrangement 16 has a dimension $D_2$ along a first direction corresponding to the direction of the $A_1$ axis. The conductive lines 30 extend along a second direction orthogonal to (or at least substantially orthogonal to) the first direction, with such second direction corresponding to the direction of the $A_2$ axis. A dimension $D_1$ extends across all of the lines 30 which are to be coupled with the circuit arrangement 16.

One of the dimensions $D_1$ and $D_2$ may be referred to as a first dimension while the other is referred to as a second dimension. It is desired that the first and second dimensions $D_1$ and $D_2$ be the same as one another (or at least substantially the same as one another, with the term "substantially the same" meaning the same to within reasonable tolerances of fabrication and measurement). Such enables the circuit arrangement 16 to match up with the conductive lines 30 that are coupled with such circuit arrangement, and thus may conserve valuable semiconductor real estate as compared to configurations in which the dimensions $D_1$ and $D_2$ are not the substantially the same as one another.

The illustrated embodiment has the dimensions $D_1$ and $D_2$ the same as one another (or at least substantially the same as one another). Such may be achieved by tailoring gate lengths 22 of CMOS devices within the circuit arrangement 16, and/or by tailoring spacing 24 between adjacent CMOS devices to achieve a desired dimension $D_2$ which matches the dimension $D_1$ of the array 202. In theory, the pitch $P_1$ within the array 202 could be modified to match the dimension $D_1$ of the array with the dimension $D_2$ of the circuit arrangement 16, but such is generally not a practical approach in that it is desired for the pitch $P_1$ to be as small as possible to achieve high integration of the memory cells 204 within the memory array 202.

It is reasonably straightforward for persons of ordinary skill to tailor the gate lengths 22 and/or the spacings 24 within the circuit arrangement 16 to achieve a desired dimension $D_2$ which matches the dimension $D_1$.

Referring to FIG. 3B, conductive interconnects 26 are shown to be formed to connect the lines 30 of the array region 202 with the conductive pads 20 associated with the circuit arrangement 16. Accordingly, if the circuit arrangement 16 is WORDLINE DRIVER circuitry and the lines 30 are wordlines, the WORDLINE DRIVER circuitry is now coupled with the wordlines and may be utilized during ACTIVATE/PRECHARGE operations associated with memory cells along the wordlines; and if the circuit arrangement 16 is SENSE AMPLIFIER circuitry and the lines 30 are digit lines, the SENSE AMPLIFIER circuitry is now coupled with the digit lines and may be utilized during READ/WRITE operations associated with memory cells along the digit lines.

Figure 4A:
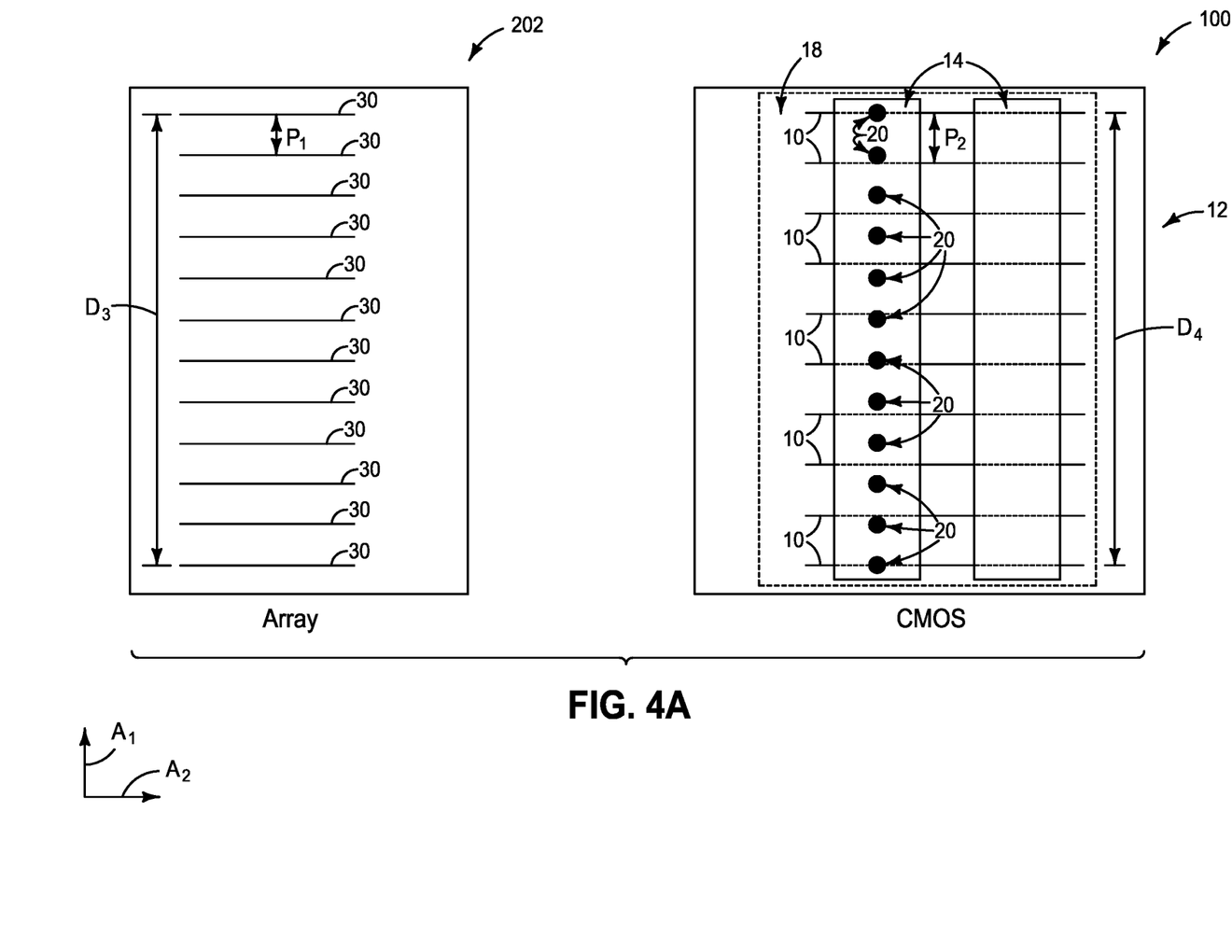
FIGS. 4A, 4B and 4C are diagrammatic top-down views of an example region of an example CMOS-containing semiconductor base and one or more example regions of integrated memory arrays proximate the base.

Referring to FIG. 4A, a portion of the array 202 is shown proximate a portion of the CMOS region 100. In contrast to the embodiment of FIG. 3A, the embodiment of FIG. 4A has the conductive lines 30 of the array region 202 extending parallel to (or at least substantially parallel to) the fins 10. The illustrated conductive lines 30 of the array region 202 are to be coupled with the circuit arrangement 18 within the CMOS region 100, and accordingly it can be desired that the illustrated dimension $D_3$ within the array region 202 be the same (or at least substantially the same) as the dimension $D_4$ within the CMOS region 100 for reasons similar to those discussed above with reference to FIG. 3A for matching the dimensions $D_1$ and $D_2$. In some embodiments, one of the dimensions $D_3$ and $D_4$ may be referred to as a first dimension and the other may be referred to as a second dimension.

It can be difficult to match the dimensions $D_3$ and $D_4$ of FIG. 4A due to the difference between the pitch $P_1$ of the conductive lines 30 within the array 202 and the pitch $P_2$ of the fins 10 within the circuit arrangement 18.

Some embodiments recognize that the dimension $D_3$ may be matched with the dimension $D_4$ by tailoring the pitch $P_2$ of the fins 10 relative to the pitch $P_1$ of the conductive lines 30. Specifically, the circuit arrangement 18 comprises a specific number of fins 10 (in the shown embodiment, comprises 10 of such fins), and the circuit arrangement is coupled with a specific number of the conductive lines 30 (in the shown embodiment, is coupled with 12 of the conductive lines).

In some embodiments, the fin pitch $P_2$ may be ascertained relative to the number of memory bits (Mbits) associated with the conductive lines 30. Specifically, each of the memory cells 204 of FIG. 1 may be considered to be an Mbit. In some embodiments, the dimension $D_3$ may be determined by multiplying the Mbit pitch along the $A_1$ axis (which will effectively be the pitch $P_1$ between the conductive lines 30) with the number of Mbits coupled with the circuit arrangement 16 (nMbit); i.e., $D_3 = P_1 \times nMbit$. Since the dimension $D_4$ is intended to be the same as the dimension $D_3$ (or at least substantially the same as the dimension $D_3$), the fin pitch can be determined by relating the number of fins 10 within the circuit arrangement 18 to the dimension $D_3$, as will be understood by persons of ordinary skill. A difficulty is that only some fin pitches are practical to fabricate, and accordingly it may be useful to create a table of suitable fin pitches relative to particular Mbit arrangements and to ascertain which fin pitches that may be practically fabricated. In the illustrated embodiment, a first set of twelve conductive lines 30 of the array 202 is coupled with a second set of ten fins 10 of the CMOS region 100. In some embodiments, the number of conductive lines 30 relative to the number of fins 10 may be in the ratio of 12:10. For instance, 24 conductive lines 30 may be coupled with 20 fins 10, 36 conductive lines 30 may be coupled with 30 fins 10, etc. The ratio of 12:10 is provided for illustrative purposes only. Any suitable ratio may be chosen, as will be understood by persons of ordinary skill.

Figure 4B:
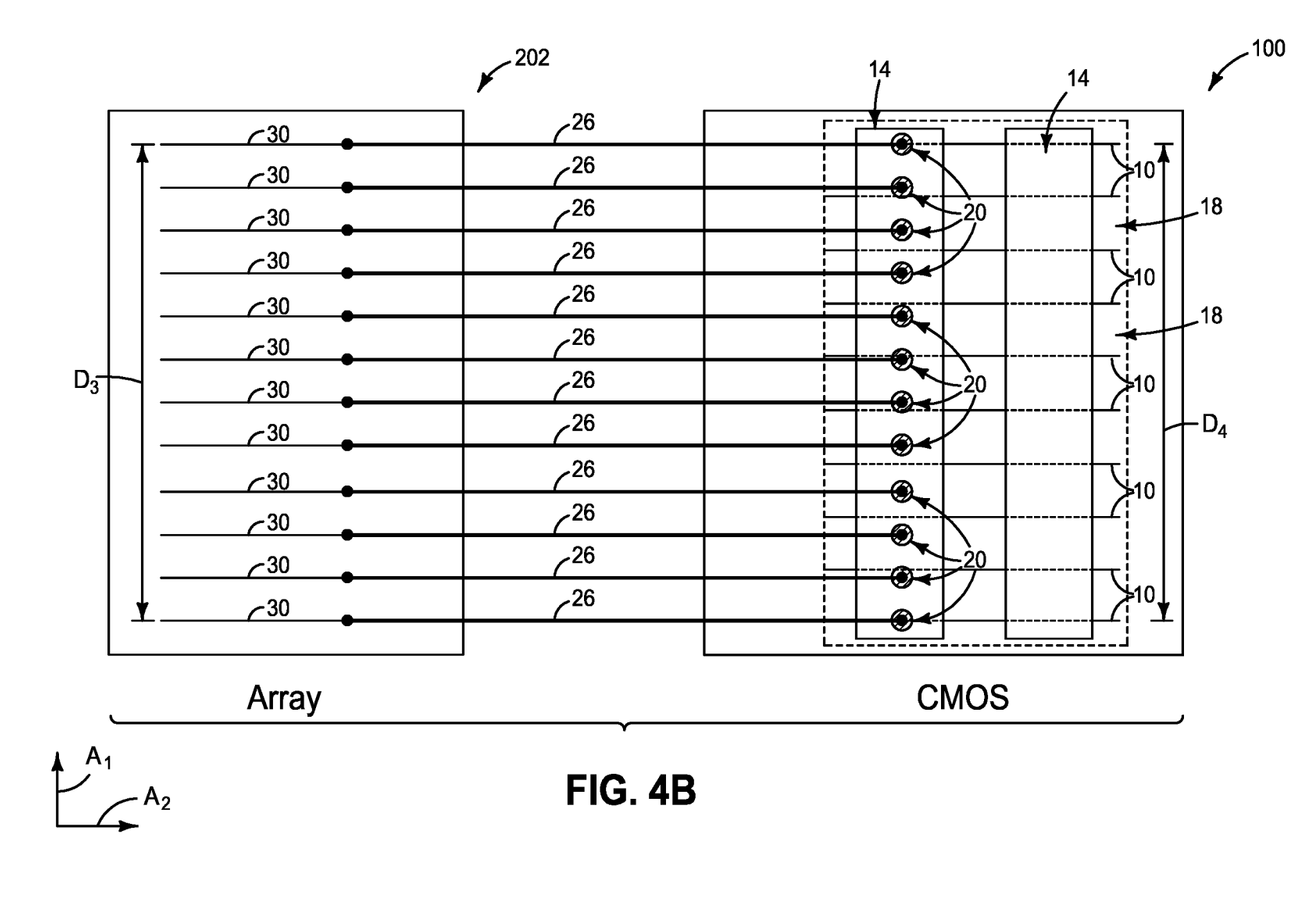

Referring to FIG. 4B, the conductive interconnects 26 are shown to be formed to connect the lines 30 of the array region 202 with the conductive pads 20 associated with the circuit arrangement 18. Accordingly, if the circuit arrangement 18 is WORDLINE DRIVER circuitry and the lines 30 are wordlines, the WORDLINE DRIVER circuitry is now coupled with the wordlines and may be utilized during READ/WRITE operations associated with memory cells along the wordlines; and if the circuit arrangement 18 is SENSE AMPLIFIER circuitry and the lines 30 are digit lines, the SENSE AMPLIFIER circuitry is now coupled with the digit lines and may be utilized during READ/WRITE operations associated with memory cells along the digit lines.

Figure 4C:
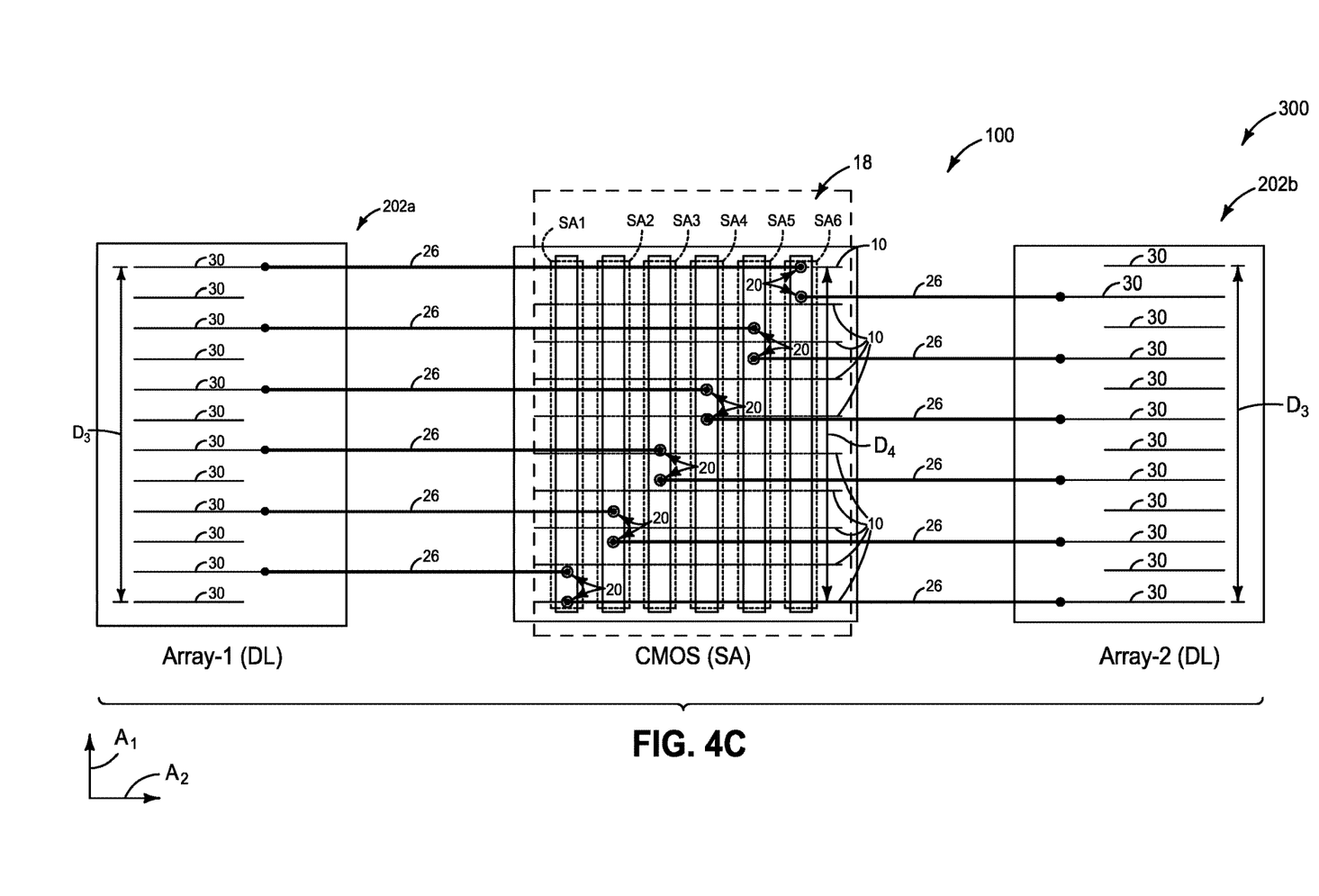

The embodiments of FIGS. 3B and 4B show all of the conductive lines within the dimensions $D_1$ and $D_3$ being coupled with the circuit arrangements 16 and 18. In other embodiments, dimensions analogous to the dimensions $D_1$ and $D_3$ of FIGS. 3B and 4B may include one or more additional conductive lines that are not coupled with the circuit arrangements. For instance, FIG. 4C shows a region of an integrated assembly 300 comprising an open architecture. The assembly includes a first memory array 202a (Array-1), a second memory array 202b (Array-2) laterally offset from the first memory array, and the CMOS region 100 laterally between the first and second memory arrays. Each of the memory arrays is shown to comprise 12 digit lines 30 which extend along the axis direction $A_2$, and which are contained within the dimension $D_3$ described above with reference to FIG. 4A.

The CMOS region comprises SENSE AMPLIFIER circuitry (SA), and is shown to comprise six sense amplifiers (SA1-SA6) within the circuit arrangement 18. The SAs of the drawings may be considered to be simplified as compared to actual SAs, as will be understood by persons of ordinary skill. The simplified SAs are utilized for illustrative purposes, and to simplify the drawings. Persons of ordinary skill will understand that the concepts described herein may be applied to more complex circuit configurations than are shown in the accompanying drawings.

Each of the memory arrays 202a and 202b has six digit lines coupled with sense amplifiers within the circuit arrangement 18, and has six digit lines which are not coupled with such sense amplifiers (but which may be coupled with other sense amplifiers laterally outward of the shown region of the assembly 300). In the shown embodiment, the digit lines which are not coupled with the illustrated sense amplifiers alternate with those that are coupled with the illustrated sense amplifiers, and specifically alternate along the direction of the $A_1$ axis.

Arrangements of the types shown in FIGS. 3A and 3B having some of the sense/access lines 30 of the array region perpendicular to the fins 10 of the CMOS region 16 would typically be utilized together with arrangements of the types shown in FIGS. 4A-C having some of the sense/access lines 30 of the array region parallel to the fins 10 of the CMOS region 18 (due to FinFET manufacturing processes generally forming all fins parallel to one another across a substrate (e.g., a semiconductor chip), and forming all gating structures parallel to one another and substantially orthogonal to the fins). Since the wordlines 206 are perpendicular to the digit lines 210 within the array 202 of FIG. 1, either the WORDLINE DRIVER circuitry within the CMOS region will have the fins 10 parallel to the wordlines 206 within the array region while the SENSE AMPLIFIER circuitry within the CMOS region has the fins 10 perpendicular to the digit lines 210 within the array region, or the WORDLINE DRIVER circuitry within the CMOS region will have the fins 10 perpendicular to the wordlines 206 while the SENSE AMPLIFIER circuitry within the CMOS region has the fins 10 parallel to the digit lines 210 within the array region.

In some embodiments, the circuit arrangement 16 of FIG. 3A may be considered to be a first circuit arrangement, and the circuit arrangement 18 of FIG. 4A may be considered to be a second circuit arrangement. The wordlines 206 are coupled with one of the first and second circuit arrangements, and the digit lines are coupled with the other of the first and second circuit arrangements (or the digit lines may be coupled with an arrangement of the type shown in FIG. 4C, which may be considered to be a subset of the generic arrangement of FIG. 4A).

In some embodiments, the fins 10 may be considered to be on a first pitch ($P_2$ of FIGS. 3A and 4A, and FP of FIG. 2), the digit lines 210 of FIG. 1 may be considered to be on a second pitch 216, and the wordlines 206 of FIG. 1 may be considered to be on a third pitch 214. The first and second pitches may be different than the first pitch, and may or may not be different than one another. In some embodiments, the pitches of the wordlines and digit lines may be smaller than the pitch of the fins to enable the memory array 202 to be highly integrated.

Figure 5:
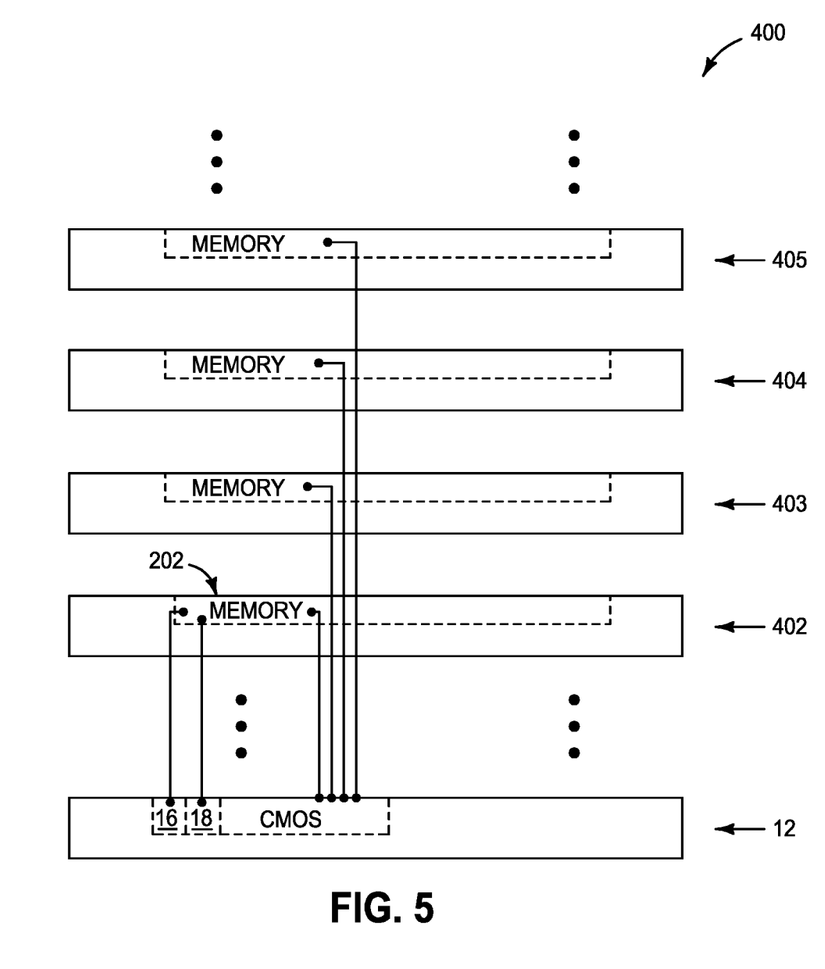
FIG. 5 is a diagrammatic side view of an example region of an example multi-deck assembly.

In some embodiments, the CMOS region 100 may be under the memory array 202 within a multideck configuration. For instance FIG. 5 shows an example multideck configuration 400 which includes a base 12, and includes several memory decks 402-405 over the base. Although the illustrated configuration includes four of the memory decks, it is to be understood that other configurations may have more than four memory decks or fewer than four memory decks. For instance, some configurations may include only a single memory deck. In some embodiments, the base 12 may be referred to as a deck which is provided beneath the memory decks 402-405.

The illustrated decks 12 and 402-405 may be considered to be examples of levels that are stacked one atop the other. The levels may be within different semiconductor dies, or at least two of the levels may be within the same semiconductor die. The memory decks 402-405 may comprise memory arrays, or at least portions of memory arrays. The memory arrays within the various decks may be the same as one another (e.g., may all be DRAM arrays, ferroelectric memory arrays, NAND memory arrays, etc.), or may be different relative to one another (e.g., some may be DRAM arrays, while others are NAND memory arrays, ferroelectric memory arrays, etc.). Also, one or more of the upper decks may include control circuitry, sensor circuitry, etc.

The memory within the deck 402 is diagrammatically indicated to contain a memory array 202 of the type described above with reference to FIG. 1. Accordingly, wordlines and digit lines (analogous to the wordlines 206 and digit lines 210 of FIG. 1) may be associated the memory deck 402.

The CMOS region 12 is shown to comprise the regions 16 and 18, and such regions are diagrammatically illustrated to be coupled with the memory array 202 within the deck 402. In some embodiments, one of the regions 16 and 18 comprises SENSE AMPLIFIER circuitry and the other comprises WORDLINE DRIVER circuitry. The SENSE AMPLIFIER circuitry may be coupled with digit lines of the memory array 202, and the WORDLINE DRIVER circuitry may be coupled with wordlines of the memory array 202.

In the shown embodiment, electrical couplings from the memory circuitries within the decks 402-405 to the CMOS circuitry within the base 12 is shown to extend through the decks. Such may be accomplished utilizing sockets or other suitable regions as conduits for conductive lines passing through the various decks. Alternatively, at least some of the electrical coupling from the decks to the base may extend laterally around the decks.

In the illustrated embodiment, the CMOS circuitry within the base 12 is directly under the memory arrays of the decks 402-405. In other embodiments, at least some of the CMOS circuitry may be laterally offset relative to the memory circuitry within the upper decks 402-405, as well as being vertically offset relative to the memory circuitry within such decks.

Although it is generally advantageous to form the fins 10 of FIG. 2 to all extend parallel to one another and entirely across the CMOS associated with the base 12, there may be applications in which it is desired to form the fins to have a different pitch within some regions of the base 12 than within other regions of the base 12.

Figure 6:
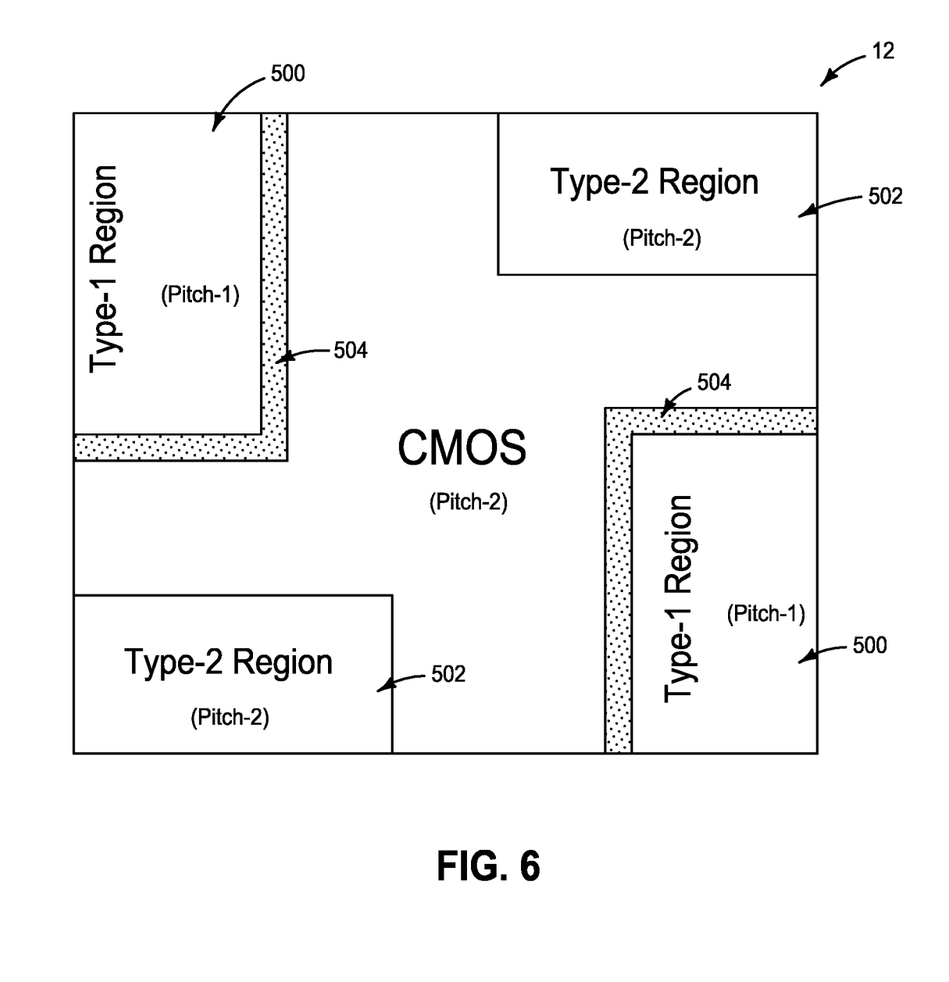
FIG. 6 is a diagrammatic top-down view of an example region of an example CMOS-containing semiconductor base.

FIG. 6 shows an example embodiment in which the base 12 comprises a pair of regions 500 which are labeled as Type-1 regions, and a pair of regions 502 which are labeled as Type-2 regions. The regions 500 may be coupled to a first set of conductive lines in a manner analogous to that described above with reference to FIGS. 4A-C such that the fins 10 are parallel to the conductive lines, and the regions 502 may be coupled to a second set of conductive lines in a manner analogous to that described above with reference to FIGS. 3A and 3B such that the fins 10 are perpendicular to the conductive lines. In some embodiments, one of the regions 500 and 502 will comprise SENSE AMPLIFIER circuitry while the other comprises WORDLINE DRIVER circuitry.

The shown embodiment has the regions 500 diagrammatically indicated to have a first pitch across the fins of the CMOS, with such first pitch being designated Pitch-1; and has the regions 502 diagrammatically indicated to have a second pitch across the fins of the CMOS, with such second pitch being designated Pitch-2. The second pitch is different than the first pitch, and accordingly buffer regions 504 (diagrammatically illustrated with stippling) are provided between the regions with Pitch-2 and the regions with Pitch-1. The buffer regions may completely lack CMOS fins and/or may have modified (or distorted) CMOS fins extending therein. In any event, the buffer regions may correspond to wasted semiconductor real estate in that they may not be suitable for fabrication of functional circuit devices. Accordingly, the embodiment of FIG. 6 may be primarily useful in applications in which it is realized that advantages achieved by modifying fin pitch within some regions of CMOS circuitry relative to other regions offset disadvantages associated with the loss of semiconductor real estate within the buffer regions 504. Of course, the buffer regions 504 are not wasted space if an application is developed which utilizes such regions for a functional circuit application.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a CMOS region, and having fins extending across the CMOS region. The fins are on a first pitch. A circuit arrangement is associated with the CMOS region and includes segments of one or more of the fins. The circuit arrangement has a first dimension along a first direction. A second region is proximate the CMOS region and includes a set of conductive lines (or other suitable conductive structures). The conductive lines (or other suitable conductive structures) extend along a second direction substantially orthogonal to the first direction. Some of the conductive lines (or other suitable conductive structures) of the set are electrically coupled with the circuit arrangement. The conductive lines (or other suitable conductive structures) are on a second pitch different from the first pitch. A second dimension is a distance across said some of the conductive lines (or other suitable conductive structures) along the first direction. The conductive lines (or other suitable conductive structures) are aligned with the circuit arrangement such that the second dimension is substantially the same as the first dimension.

Some embodiments include an integrated assembly comprising a CMOS region, and comprising fins associated with the CMOS region. Circuit arrangements are associated with the CMOS region and comprise segments of one or more of the fins. The circuit arrangements comprise a first circuit arrangement and a second circuit arrangement. A memory region is proximate the CMOS region and comprises two intersecting sets of conductive lines. The conductive lines of one of the sets are wordlines and the conductive lines of the other of the sets are digit lines. The wordlines extend along a first direction, and the digit lines extend along a second direction which is substantially orthogonal to the first direction. The first circuit arrangement has a first dimension along the first direction, and the second circuit arrangement has a second dimension along the second direction. Some of the wordlines are coupled with the second circuit arrangement and some of the digit lines are coupled with the first circuit arrangement. A third dimension is along the second direction and is a distance across all of the wordlines that are coupled with the second circuit arrangement. A fourth dimension is along the first direction and is a distance across all of the digit lines that are coupled with the first circuit arrangement. The wordlines are aligned with the second circuit arrangement such that the third dimension is substantially the same as the second dimension. The digit lines are aligned with the first circuit arrangement such that the fourth dimension is substantially the same as the first dimension.

Some embodiments include an integrated assembly comprising a semiconductor base, and a CMOS region associated with the base. Fins extend across the CMOS region and are on a first pitch. Circuit arrangements are associated with the CMOS region and comprise segments of one or more of the fins. The circuit arrangements comprise a WORDLINE DRIVER arrangement and a SENSE AMPLIFIER arrangement. A memory deck is over the base. Wordlines and digit lines are associated with the memory deck. The wordlines extend along a first direction, and the digit lines extend along a second direction which is substantially orthogonal to the first direction. The wordlines are on a second pitch and the digit lines are on a third pitch. The second and third pitches are different than the first pitch. The SENSE AMPLIFIER arrangement has a first dimension along the first direction, and the WORDLINE DRIVER arrangement has a second dimension along the second direction. Some of the wordlines are coupled with the WORDLINE DRIVER arrangement and some of the digit lines are coupled with the SENSE AMPLIFIER arrangement. A third dimension is along the second direction and is a distance across all of the wordlines that are coupled with the WORDLINE DRIVER arrangement. A fourth dimension is along the first direction and is a distance across all of the digit lines that are coupled with the SENSE AMPLIFIER arrangement. The wordlines are aligned with the WORDLINE DRIVER arrangement such that the third dimension is substantially the same as the second dimension. The digit lines are aligned with the SENSE AMPLIFIER arrangement such that the fourth dimension is substantially the same as the first dimension.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a CMOS region;
   fins extending across the CMOS region, the fins being on a first pitch;
   a circuit arrangement associated with the CMOS region and comprising segments of one or more of the fins; the circuit arrangement having a first dimension along a first direction;
   a second region proximate the CMOS region; and
   conductive structures associated with the second region and extending along a second direction substantially orthogonal to the first direction; some of the conductive structures being electrically coupled with the circuit arrangement; the conductive structures being on a second pitch different from the first pitch; a second dimension being a distance across said some of the conductive structures along the first direction; the conductive structures being aligned with the circuit arrangement such that the second dimension is substantially the same as the first dimension.

2. The integrated assembly of claim 1 wherein the fins extend along the first direction.

3. The integrated assembly of claim 1 wherein the fins extend along the second direction.

4. The integrated assembly of claim 1 wherein the conductive structures are wordlines.

5. The integrated assembly of claim 1 wherein the conductive structures are digit lines.

6. The integrated assembly of claim 1 wherein the circuit arrangement comprises one or more WORDLINE DRIVERS.

7. The integrated assembly of claim 1 wherein the circuit arrangement comprises one or more SENSE AMPLIFIERS.

8. The integrated assembly of claim 1 wherein the second region is laterally offset relative to the CMOS region.

9. The integrated assembly of claim 1 wherein the second region is vertically offset relative to the CMOS region.

10. The integrated assembly of claim 9 wherein the second region is directly over the CMOS region.

11. The integrated assembly of claim 1 wherein the only of the conductive structures within said second dimension are said some of the conductive structures that are electrically coupled with the circuit arrangement.

12. The integrated assembly of claim 1 wherein another of the conductive structures is within said second dimension in addition to said some of the conductive structures that are electrically coupled with the circuit arrangement.

13. An integrated assembly, comprising:
a CMOS region;
fins associated with the CMOS region;
circuit arrangements associated with the CMOS region and comprising segments of one or more of the fins; the circuit arrangements comprising a first circuit arrangement and a second circuit arrangement;
a memory region proximate the CMOS region and comprising two intersecting sets of conductive lines; the conductive lines of one of the sets being wordlines and the conductive lines of the other of the sets being digit lines; the wordlines extending along a first direction, and the digit lines extending along a second direction which is substantially orthogonal to the first direction;
the first circuit arrangement having a first dimension along the first direction, and the second circuit arrangement having a second dimension along the second direction;
some of the wordlines being coupled with the second circuit arrangement and some of the digit lines being coupled with the first circuit arrangement; a third dimension being along the second direction and being a distance across all of the wordlines that are coupled with the second circuit arrangement, and a fourth dimension being along the first direction and being a distance across all of the digit lines that are coupled with the first circuit arrangement;
the wordlines being aligned with the second circuit arrangement such that the third dimension is substantially the same as the second dimension; and
the digit lines being aligned with the first circuit arrangement such that the fourth dimension is substantially the same as the first dimension.

14. The integrated assembly of claim 13 wherein the first circuit arrangement includes one or more SENSE AMPLIFIERS.

15. The integrated assembly of claim 13 wherein the second circuit arrangement includes one or more WORDLINE DRIVERS.

16. The integrated assembly of claim 13 wherein the memory region is laterally offset relative to the CMOS region.

17. The integrated assembly of claim 13 wherein the memory region is vertically offset relative to the CMOS region.

18. The integrated assembly of claim 17 wherein the memory region is directly over the CMOS region.

19. The integrated assembly of claim 13 wherein the fins have substantially the same pitch across the first and second circuit arrangements.

20. The integrated assembly of claim 13 wherein the fins have a different pitch across the first circuit arrangement than across the second circuit arrangement.

21. The integrated assembly of claim 20 comprising a buffer region between the first and second circuit arrangements.

22. The integrated assembly of claim 21 wherein at least a portion of said buffer region lacks the fins.

23. The integrated assembly of claim 13 wherein the fins are on a first pitch, the digit lines are on a second pitch and the wordlines are on a third pitch; and wherein the first pitch is different relative to the second and third pitches.

24. The integrated assembly of claim 23 wherein the second and third pitches are smaller than the first pitch.

25. The integrated assembly of claim 23 wherein the second pitch is substantially the same as the third pitch.

26. An integrated assembly, comprising:
a semiconductor base;
a CMOS region associated with the base;
fins extending across the CMOS region and being on a first pitch;
circuit arrangements associated with the CMOS region and comprising segments of one or more of the fins; the circuit arrangements comprising a WORDLINE DRIVER arrangement and a SENSE AMPLIFIER arrangement;
a memory deck over the base;
wordlines and digit lines associated with the memory deck; the wordlines extending along a first direction, and the digit lines extending along a second direction which is substantially orthogonal to the first direction; the wordlines being on a second pitch and the digit lines being on a third pitch; the second and third pitches being different than the first pitch;
the SENSE AMPLIFIER arrangement having a first dimension along the first direction, and the WORDLINE DRIVER arrangement having a second dimension along the second direction;
some of the wordlines being coupled with the WORDLINE DRIVER arrangement and some of the digit lines being coupled with the SENSE AMPLIFIER arrangement; a third dimension being along the second direction and being a distance across all of the wordlines that are coupled with the WORDLINE DRIVER arrangement, and a fourth dimension being along the first direction and being a distance across all of the digit lines that are coupled with the SENSE AMPLIFIER arrangement;
the wordlines being aligned with the WORDLINE DRIVER arrangement such that the third dimension is substantially the same as the second dimension; and
the digit lines being aligned with the SENSE AMPLIFIER arrangement such that the fourth dimension is substantially the same as the first dimension.

27. The integrated assembly of claim 26 wherein said some of the digit lines that are coupled with the SENSE AMPLIFIER arrangement are first digit lines, and alternate with second digit lines which are not coupled with the SENSE AMPLIFIER arrangement; and wherein the fourth dimension extends across all of the first digit lines and an equal number of the second digit lines as of the first digit lines.

28. The integrated assembly of claim 26 wherein the memory deck is one of two or more decks over the semiconductor base, with each of said two or more decks having circuitry associated therewith that is coupled with circuitry associated with the semiconductor base.

29. The integrated assembly of claim 26 wherein the second and third pitches are less than the first pitch.

30. The integrated assembly of claim 26 wherein a memory array is associated with the memory deck, and is directly over one or both of the SENSE AMPLIFIER arrangement and the WORDLINE DRIVER arrangement.

31. The integrated assembly of claim 30 wherein the memory array comprises DRAM.

32. The integrated assembly of claim 26 wherein the second pitch is different from the third pitch.

33. The integrated assembly of claim 26 wherein the second pitch is substantially the same as the third pitch.

* * * * *